(12) United States Patent
Asano

(10) Patent No.: US 12,317,459 B2
(45) Date of Patent: May 27, 2025

(54) POWER CONTROL UNIT

(71) Applicant: TOYOTA JIDOSHA KABUSHIKI KAISHA, Toyota (JP)

(72) Inventor: Takashi Asano, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 221 days.

(21) Appl. No.: 18/216,080

(22) Filed: Jun. 29, 2023

(65) Prior Publication Data

US 2024/0008230 A1    Jan. 4, 2024

(30) Foreign Application Priority Data

Jul. 4, 2022  (JP) .................................. 2022-107940

(51) Int. Cl.
*H05K 7/20* (2006.01)
*H02K 11/33* (2016.01)
*H02M 7/00* (2006.01)

(52) U.S. Cl.
CPC ......... *H05K 7/20927* (2013.01); *H02K 11/33* (2016.01); *H02M 7/003* (2013.01)

(58) Field of Classification Search
CPC ... H05K 7/2089–20945; H05K 5/0217; H02K 11/33; H02M 7/003; H02M 3/003
See application file for complete search history.

(56) References Cited

U.S. PATENT DOCUMENTS

| | | | |
|---|---|---|---|
| 2003/0057705 A1 | 3/2003 | Kusumi et al. | |
| 2015/0229206 A1* | 8/2015 | Kaji ....................... | H02M 7/003 307/43 |
| 2015/0305188 A1* | 10/2015 | Maeda ................ | H05K 7/1432 361/728 |
| 2016/0037654 A1* | 2/2016 | Kosuga ................ | H02M 7/003 361/807 |
| 2018/0279504 A1* | 9/2018 | Yoshikawa ............ | H05K 7/209 |
| 2019/0098777 A1* | 3/2019 | Nakatsu ................ | H02M 1/327 |

FOREIGN PATENT DOCUMENTS

| | | |
|---|---|---|
| JP | 2007-050887 A | 3/2007 |
| JP | 2019-110721 A | 7/2019 |

* cited by examiner

*Primary Examiner* — Jacob R Crum
(74) *Attorney, Agent, or Firm* — Oliff PLC

(57) ABSTRACT

A power control unit in which a converter is disposed on an inverter, and a gap is formed between an inverter case and a converter case, wherein the inverter has an inverter protruding portion that protrudes toward the converter side on a surface of the inverter case which faces the converter, the converter has a converter protruding portion that protrudes toward the inverter side on a surface of the lower cover which faces the inverter that closes an opening formed on the lower surface side of a case main body of a converter case, the inverter protruding portion and the converter protruding portion are disposed in contact with each other, and the converter protruding portion is disposed on the lower cover to correspond to a position of a rib that can come into contact with the lower cover.

2 Claims, 4 Drawing Sheets

POWER CONTROL UNIT

CROSS-REFERENCE TO RELATED APPLICATION

This application claims priority to Japanese Patent Application No. 2022-107940 filed on Jul. 4, 2022, incorporated herein by reference in its entirety.

BACKGROUND

1. Technical Field

The present disclosure relates to a power control unit.

2. Description of Related Art

Japanese Patent Application No. 2007-050887 (JP 2007-050887 A) discloses a power control unit in which an inverter in which inverter components are accommodated in a case and a converter in which converter components are accommodated in a case are disposed vertically.

SUMMARY

When the converter is disposed above the inverter and a gap is formed between the inverter and a converter case, there is a problem that a resonance sound is generated from the gap due to primary resonance (membrane vibration) of an upper surface of a case of the inverter.

The present disclosure has been made in view of the above problems, and an object thereof is to provide a power control unit capable of reducing a resonance sound from a gap formed between an inverter case and a converter case.

In order to solve the above-described problems and achieve the object, the power control unit according to the present disclosure includes an inverter in which inverter components are accommodated in an inverter case, and a converter in which converter components are accommodated in a converter case, wherein the converter is disposed on the inverter, and a gap is formed between the inverter case and the converter case, the inverter has an inverter protruding portion that protrudes toward the converter side on a surface of the inverter case that faces the converter, the converter case is configured of a case main body and a lower cover that closes an opening formed on a lower surface side of the case main body, the converter has a converter protruding portion that protrudes toward the inverter side on a surface of the lower cover that faces the inverter, the inverter protruding portion and the converter protruding portion are disposed in contact with each other, and the converter protruding portion is disposed on the lower cover to correspond to a position of a rib provided on the case main body to be exposed from the opening and configured to be able to come into contact with the lower cover.

Thus, primary resonance (membrane vibration) of an upper surface of the inverter case can be curbed by bringing the inverter protruding portion and the converter protruding portion into contact with each other, and thus a resonance sound from the gap formed between the inverter case and the converter case can be reduced.

Further, in the above, the lower cover may be a water passage cover that seals a water passage provided in a lower portion of the case main body, and the rib may be a straightening rib that regulates a flow of cooling water flowing through the water passage.

Thus, it is possible to curb deformation of the water passage cover due to an increase in a water pressure in a water passage by bringing the inverter protruding portion and the converter protruding portion into contact with each other.

The power control unit according to the present disclosure can curb the primary resonance (the membrane vibration) of the upper surface of the inverter case by bringing the inverter protruding portion and the converter protruding portion into contact with each other, and thus it is possible to reduce a resonance sound from the gap formed between the inverter case and the converter case.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Hereinafter, an embodiment of a power control unit according to the present disclosure will be described. The present disclosure is not limited by the embodiment.

Figure 1:
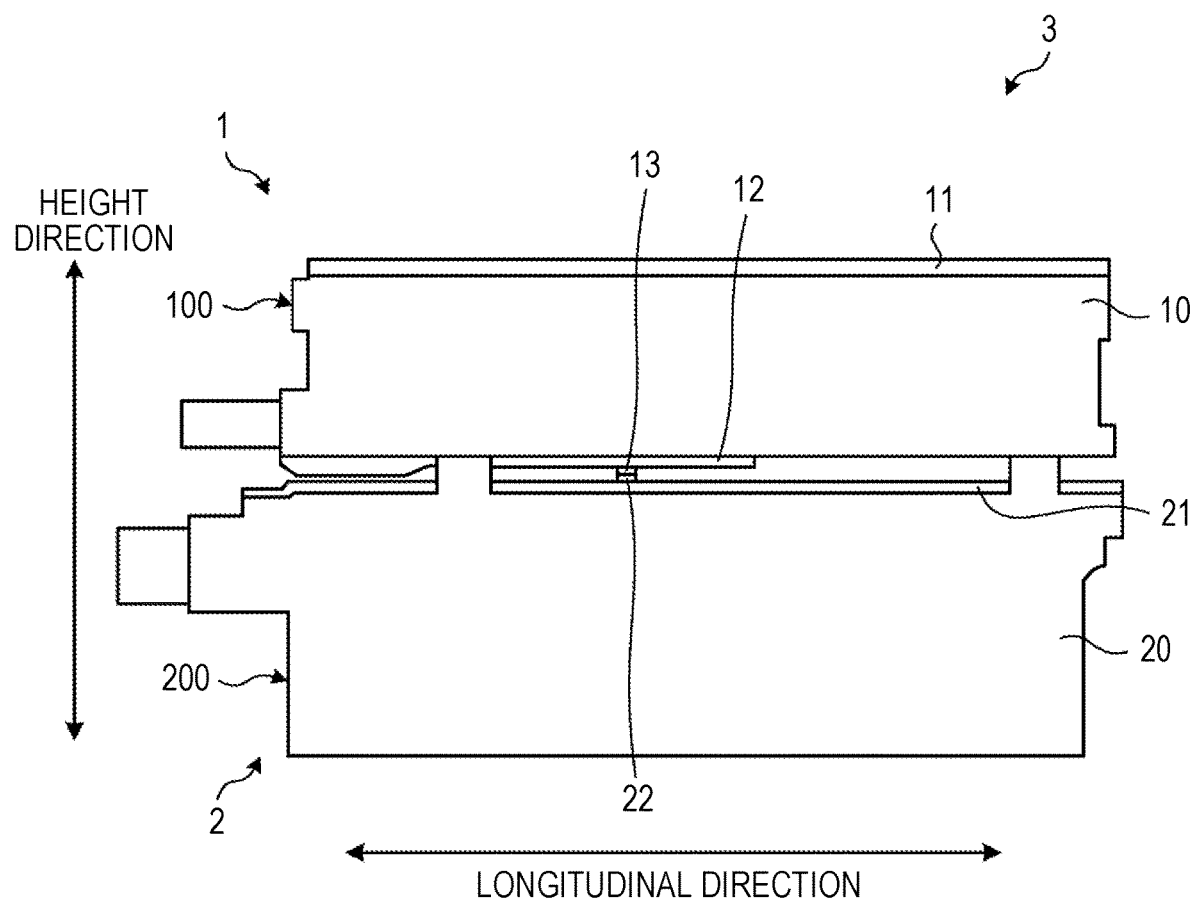
FIG. 1 is a schematic diagram showing a schematic configuration of a power control unit according to an embodiment.
Figure 2:
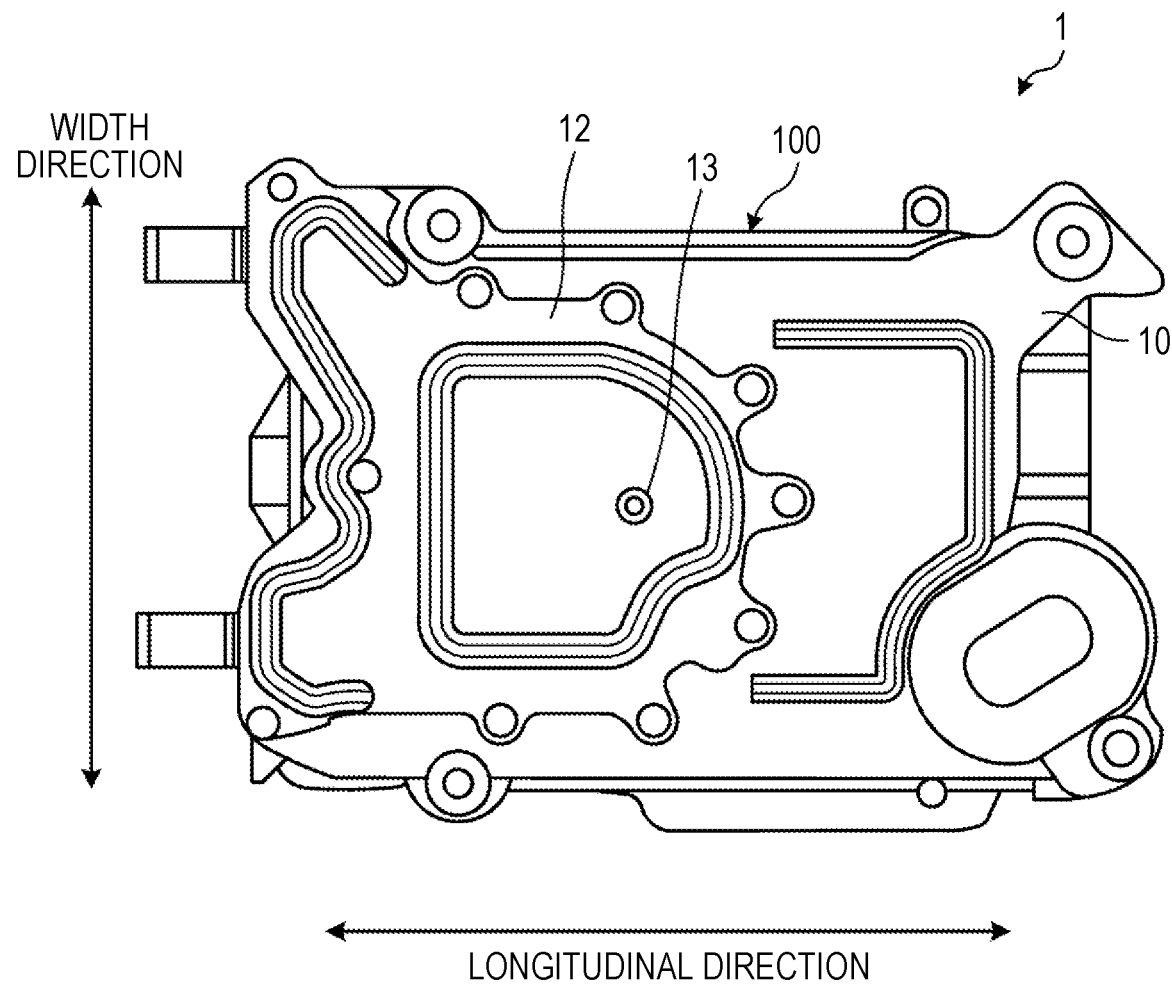
FIG. 2 is a bottom view of a DC-DC converter according to the embodiment.
Figure 3:
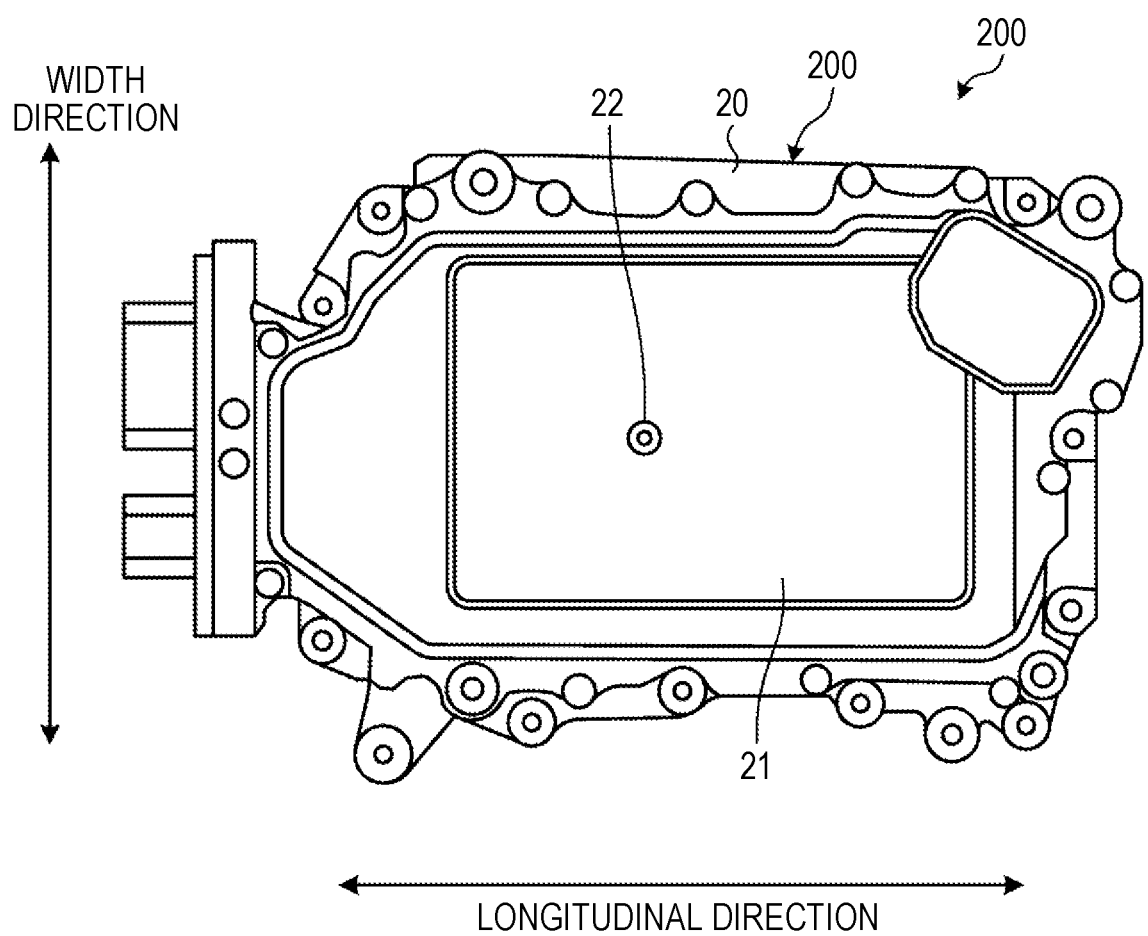
FIG. 3 is a top view of an inverter according to the embodiment.

FIG. 1 is a schematic diagram showing a schematic configuration of a power control unit 3 according to an embodiment. FIG. 2 is a bottom view of a DC-DC converter 1 according to the embodiment. FIG. 3 is a top view of an inverter 2 according to the embodiment.

The power control unit 3 according to the embodiment is mounted in an electric vehicle and is used to control electric power supplied from a battery to a rotating electric machine, for example. In the power control unit 3 according to the embodiment, the DC-DC converter 1 and the inverter 2 are independent of each other, and the DC-DC converter 1 is disposed above the inverter 2.

The DC-DC converter 1 includes a converter case 100 configured of a case main body 10 that accommodates converter components, an upper cover 11 that covers an opening formed in an upper surface side of the case main body 10, and a water passage cover 12 that covers an opening formed in a lower surface side of the case main body 10. The water passage cover 12 is a cover member that seals a water passage provided in a lower portion of the case main body 10. The upper cover 11 and the water passage cover 12 are fastened to the case main body 10 by bolts or the like that are fastening members.

The inverter 2 includes an inverter case 200 configured of a case main body that accommodates inverter components, and an upper cover 21 that covers an opening formed in an upper surface side of the case main body 20. The upper cover 21 is fastened to the case main body 20 by bolts or the like that are fastening members.

The case main body 10 of the DC-DC converter 1 and the case main body of the inverter 2 are fastened by bolts or the like that are fastening members while the case main body 10 of the DC-DC converter 1 is placed on the upper portion of the case main body of the inverter 2.

In the power control unit 3 according to the embodiment, as shown in FIG. 1, a gap is formed between the converter case 100 and the inverter case 200 in a height direction of the power control unit 3. In the following description, the height direction of the power control unit 3 is also simply referred to as a "height direction."

In the DC-DC converter 1, a converter protruding portion 13 that protrudes toward the inverter 2 side in the height direction is provided on a lower surface of the water passage cover 12 that faces the inverter 2. In the inverter 2, an inverter protruding portion 22 that protrudes toward the DC-DC converter 1 side in the height direction is provided on an upper surface of the upper cover 21 that faces the DC-DC converter 1. The converter protruding portion 13 and the inverter protruding portion 22 are respectively disposed on the water passage cover 12 and the upper cover 21 so that their positions coincide with each other in a longitudinal direction and a width direction of the power control unit 3, and have a structure in which the converter protruding portion 13 and the inverter protruding portion 22 are in contact with each other. In the following description, the longitudinal direction and the width direction of the power control unit 3 are also simply referred to as a "longitudinal direction" and a "width direction," respectively.

In order to provide the structure in which the converter protruding portion 13 and the inverter protruding portion 22 are in contact with each other, it is preferable to set a lower limit of a tolerance of a gap between the converter protruding portion 13 and the inverter protruding portion 22 to 0 or less. Moreover, it is preferable to set an upper limit of the tolerance of the gap between the converter protruding portion 13 and the inverter protruding portion 22 depending on a strength of the case main body 10 of the DC-DC converter 1.

Figure 4:
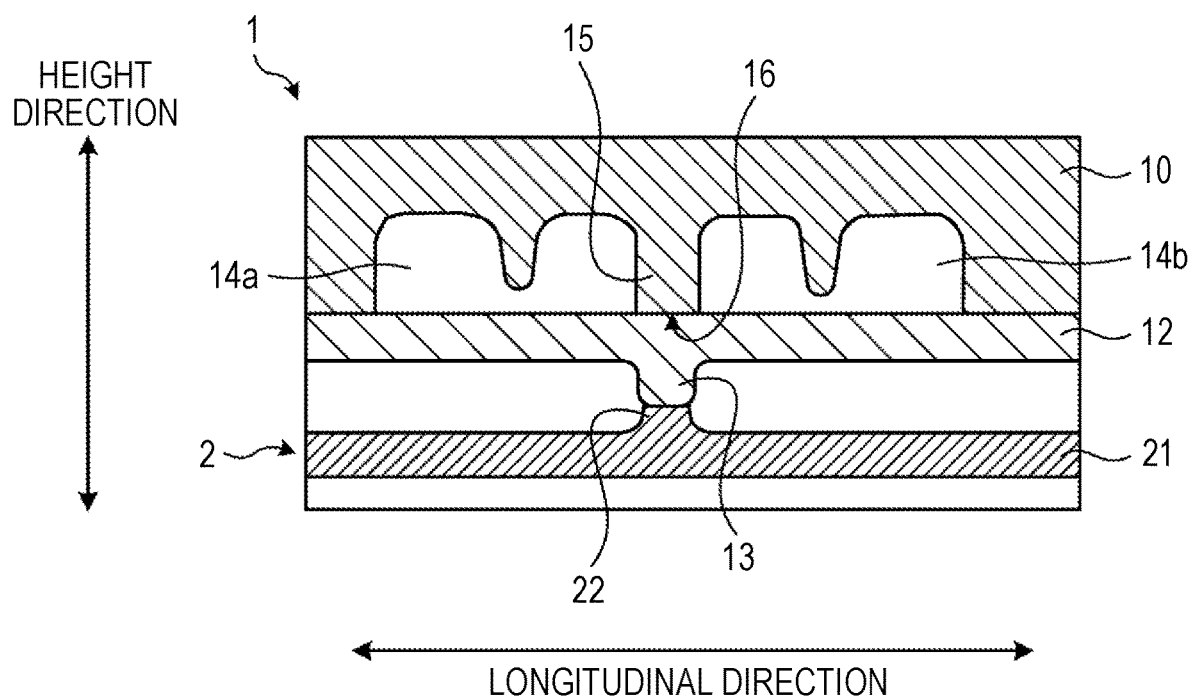
FIG. 4 is an enlarged cross-sectional view of the power control unit according to the embodiment which is cut in a longitudinal direction at positions of a converter protruding portion and an inverter protruding portion.

FIG. 4 is an enlarged cross-sectional view of the power control unit 3 according to the embodiment which is cut in the longitudinal direction at positions of the converter protruding portion 13 and the inverter protruding portion 22.

In the power control unit 3 according to the embodiment, as shown in FIG. 4, water passages 14a and 14b through which cooling water flows are provided in the lower portion of the case main body 10 of the DC-DC converter 1 to be exposed from the opening formed in the lower portion of the case main body 10. The water passages 14a and 14b are provided for cooling the case main body 10, the converter components, and the like, for example, by receiving heat generated by energizing the converter components with the cooling water flowing through the water passages 14a and 14b via the case main body 10.

Further, a straightening rib 15 that is disposed to partition the water passages 14a and 14b in the longitudinal direction and regulates a flow of the cooling water flowing through the water passages 14a and 14b is provided on the lower portion of the case main body 10 to be exposed from the opening. The straightening rib 15 has a receiving surface 16 that can come into contact with the water passage cover 12 at a tip end thereof. In the power control unit 3 according to the embodiment, the converter protruding portion 13 is disposed on the water passage cover 12 to correspond to a position of the straightening rib 15. That is, when the water passage cover 12 is seen from below in the height direction, the converter protruding portion 13 is disposed on the water passage cover 12 at the same position as the receiving surface 16 of the straightening rib 15 in the longitudinal direction and the width direction. Thus, a load received by the converter protruding portion 13 due to the contact with the inverter protruding portion 22 can be released to the side of the case main body 10 via the straightening rib 15, and deformation of the water passage cover 12 can be curbed.

In the power control unit 3 according to the embodiment, primary resonance (membrane vibration) of the upper cover 21 forming the upper surface of inverter case 200 can be curbed, and a resonance sound from a gap between the converter case 100 and the inverter case 200 can be reduced by bringing the converter protruding portion 13 provided on the water passage cover 12 of the DC-DC converter 1 and the inverter protruding portion 22 provided on the upper cover 21 of the inverter 2 into contact with each other.

The inverter protruding portion 22 is preferably disposed at a position close to the center of the upper surface of the upper cover 21 within a range in which the converter protruding portion 13 can be disposed on the water passage cover 12 provided on the DC-DC converter 1. Thus, the converter protruding portion 13 and the inverter protruding portion 22 can be in contact with each other at a position at which an amplitude of the primary resonance (the membrane vibration) of the upper cover 21 is relatively large, and thus the primary resonance (the membrane vibration) of the upper cover 21 can be effectively curbed. The number of inverter protruding portions 22 is not limited to one, a plurality of inverter protruding portions 22 may be provided on the upper cover 21 of the inverter 2, and a plurality of converter protruding portions 13 may be provided on the water passage cover 12 of the DC-DC converter 1 corresponding to the plurality of inverter protruding portions 22.

Further, in the power control unit 3 according to the embodiment, since the water passage cover 12 of the DC-DC converter 1 is pressed on the side of the case main body 10 by bringing the converter protruding portion 13 and the inverter protruding portion 22 into contact with each other, it is possible to curb deformation of the water passage cover 12 due to an increase in a water pressure in the water passages 14a and 14b of the DC-DC converter 1, thereby improving sealing performance.

What is claimed is:

1. A power control unit comprising:
an inverter in which inverter components are accommodated in an inverter case; and
a converter in which converter components are accommodated in a converter case,
wherein the converter is disposed on the inverter, and a gap is formed between the inverter case and the converter case,
the inverter has an inverter protruding portion that protrudes toward the converter side on a surface of the inverter case that faces the converter,
the converter case is configured of a case main body and a lower cover that closes an opening formed on a lower surface side of the case main body,
the converter has a converter protruding portion that protrudes toward the inverter side on a surface of the lower cover that faces the inverter,
the inverter protruding portion and the converter protruding portion are disposed in contact with each other, and
the converter protruding portion is disposed on the lower cover to correspond to a position of a rib provided on the case main body to be exposed from the opening and configured to come into contact with the lower cover.

2. The power control unit according to claim 1, wherein:
the lower cover is a water passage cover that seals a water passage provided in a lower portion of the case main body; and
the rib is a straightening rib that regulates a flow of cooling water flowing through the water passage.

* * * * *